United States Patent [19]

Ida

[11] Patent Number: 4,461,034
[45] Date of Patent: Jul. 17, 1984

[54] UNLOCKING ATTENUATOR FOR AUTOMATIC TUNING RECEIVER

[75] Inventor: Yasuhiro Ida, Saitama, Japan

[73] Assignee: Clarion Co., Ltd., Tokyo, Japan

[21] Appl. No.: 290,517

[22] Filed: Aug. 6, 1981

[30] Foreign Application Priority Data

Aug. 15, 1980 [JP]  Japan ............................ 55-116189[U]

[51] Int. Cl.$^3$ .............................................. H03J 7/18
[52] U.S. Cl. .................................... 455/161; 455/249; 455/283
[58] Field of Search ............... 455/161, 166, 168, 169, 455/249, 250, 254, 283, 284, 291

[56] References Cited

U.S. PATENT DOCUMENTS

| | | | |
|---|---|---|---|
| 4,262,363 | 4/1981 | Wiechmann et al. | 455/161 |
| 4,300,238 | 11/1981 | Konishi et al. | 455/161 |
| 4,357,712 | 11/1982 | Kawakami | 455/161 |

FOREIGN PATENT DOCUMENTS 2006  1/1979  Japan .................................. 455/249

Primary Examiner—Jin F. Ng
Attorney, Agent, or Firm—Wallenstein, Wagner, Hattis, Strampel & Aubel

[57] ABSTRACT

An automatic tuning receiver having an automatic tuning system which comprises an antenna input attenuator for attenuating antenna inputs and a sensitivity switching device, the sensitivity switching device having two positions, one controlling the attenuator to a high continuation condition for local station searching and alternatively to a low attenuation condition for distant station searches. In the high attenuation condition a switching means is further responsive to muting signals derived from the receiver so as to maintain the attenuator in a high attenuation condition during search, at the end of which time the search ceases, the receiver locks on the desired signal, and the disappearance of the muting signal causes the attenuator to revert to a low attenuation condition, thereby preserving an improved signal to noise condition in the receiver.

10 Claims, 2 Drawing Figures

UNLOCKING ATTENUATOR FOR AUTOMATIC TUNING RECEIVER

BACKGROUND OF THE INVENTION

1. Field of the Invention

This invention relates to an automatic tuning receiver, and more particularly to a receiver having a tuning means which generates search muting signals during the sweeping operation and wherein the sensitivity for stopping the sweeping operation can be controlled by attenuating the antenna inputs by means of the search muting signals, the attenuating mode being released after the sweeping operation stops.

2. Description of the Prior Art

In an automatic tuning receiver arranged to stop the sweeping operation by detecting electric field intensities of received signals, there is usually provided a switch for switching to a low (LO) sensitivity setting for stopping sweeping operation solely in response to signals having electric field intensities higher than a predetermined value and a high high (DX) sensitivity setting for stopping the sweeping operation by detecting signals having electric field intensities lower than the above predetermined value. The switching action between the LO and DX stations has generally been performed in response if required to attenuate antenna inputs or not.

However, in such conventional switching system, antenna inputs in the low sensitivity setting remain in the attenuated condition not only during the sweeping operation but also after the sweeping operation ceases, thus causing a deterioration of signal-to-noise ratio due to noises generated inside the receiver.

OBJECT OF THE INVENTION

It is therefore an object of the invention to solve the above problem in the conventional tuning receiver, and more specifically to cause an automatic tuning receiver to cancel the attenuation of antenna input signals in the low sensitivity setting after the sweeping operation stops.

SUMMARY OF THE INVENTION

In accordance with the present invention, there is provided an automatic tuning receiver which comprises:
an AM radio receiver having an automatic tuning means;
a first attenuating means connected to said AM radio receiver for attenuating antenna input signals;
a sensitivity switching device connected to said attenuating means and said automatic tuning means; and wherein
said attenuating means is controlled arranged to vary its attenuating ratio by search muting signals from said automatic tuning means in response to the switching action of said sensitivity switching device.

DETAILED DESCRIPTION OF THE PREFERRED EMBODIMENTS

The present invention will now be described in detail referring to the preferred embodiments illustrated in the accompanying drawings.

Figure 1:
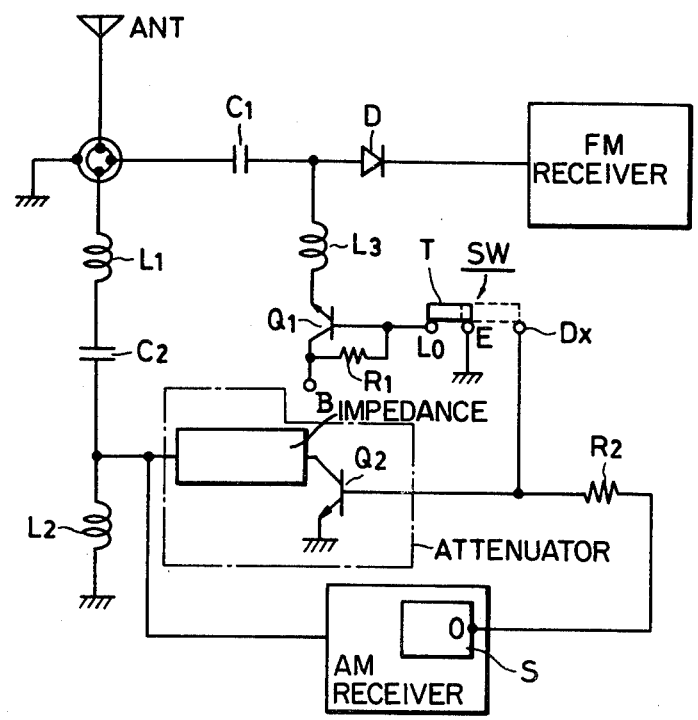
FIG. 1 shows a circuit diagram of an embodiment according to the present invention.

In FIG. 1, an antenna ANT is connected to an FM receiver FMT through a diode D (a p-i-n diode) interposed in series therebetween. The antenna ANT is grounded through an AM noise preventing coil $L_1$, an antenna connecting capacitor $C_2$ and an AM antenna loading coil $L_2$, all connected in series. The junction of the AM antenna connecting capacitor $C_2$ and the AM antenna loading coil $L_2$ is also connected both to an AM receiver AMT including a conventional automatic tuning means S, and to an antenna input attenuating means ATT. The antenna input attenuating means ATT comprises an impedance element Z having a capacitor or a resistor and a transistor $Q_2$ having a collector terminal connected to impedance element Z and an emitter terminal connected to the ground. The base terminal of the transistor $Q_2$ is connected to a search muting signal output terminal O of the automatic tuning means S and to a DX terminal of a sensitivity switching device SW. This part of the circuit is, (as is referred to in the claims) a means responsive to a control signal (at the terminal O) for operating an attenuating means, (the impedance Z and the transistor $Q_2$) to, a signal attenuating condition when the movable contact T is on the LO terminal.) The sensitivity switching device SW is of a type having one movable contact and two stationary contacts. A common terminal E of the sensitivity switching device SW is grounded and a switching plate T always contacting terminal E is movable into contact with either a DX terminal or a LO terminal. The junction of the FM antenna connecting capacitor $C_1$ and the Diode D is connected to the emitter terminal of a transistor $Q_1$ through an FM antenna loading coil $L_3$ interposed in series. The collector terminal of the transistor $Q_1$ is connected to a power source B as well as to a base terminal of the same transistor $Q_1$ through a resistor $R_1$. The base terminal is further connected to the LO terminal of the sensitivity switching device SW.

The function of the device as constructed above according to the present invention will now be described.

(a) Under DX setting:

When the switching plate T of the sensitivity switching device SW is in contact with the DX terminal (as shown by a dashed line in the drawings), the transistor $Q_2$ is brought to an off condition with its base terminal grounded, and accordingly, AM antenna input signals conducted through the AM noise preventing coil $L_1$ and the AM antenna connecting capacitor $C_2$ are applied to the AM receiver AMT without being attenuated.

At the same time, the transistor $Q_1$ is put in an on-condition with its base terminal being provided with a bias by the power source B through the resistor $R_1$, and accordingly, the diode D is supplied with forwardly directed voltage from the power source B through the FM antenna loading coil $L_3$ to be in a low impedance condition. Therefore, FM antenna input signals conducted through the FM antenna connecting capacitor $C_1$ are applied to the FM receiver FMT without being attenuated.

(b) Under LO setting:

When the switching plate T of the sensitivity switching device SW contacts the LO terminal (as shown by a solid line in the drawings), the transistor $Q_2$, with its base terminal now released from the ground, is subject to control by search muting signals from the automatic tuning means S, so as to be switched into an off state or an on state.

Search muting signals of +5 V, for example, are put out only during the sweeping operation of the automatic tuning means S, but are not put out after the sweeping operation stops. Therefore, during the sweeping operation, the transistor $Q_2$ is held in its on condition to attenuate AM antenna input signals through the impedance element Z. On the other hand, after the sweeping operation stops the transistor $Q_2$ is brought in its off condition so as thereafter not to annenuate AM antenna input signals. The attenuation ratio can be adjusted by varying the value of the impedance element.

At the same time, the transistor $Q_1$ is cut off with its base terminal grounded, and accordingly, the diode D is not supplied with voltage from the power source B and thus is in a high impedance condition, thus attenuating FM antenna input signals.

As apparent from the above description, according to the present invention, since the antenna input attenuating means is controlled by search muting signals from the automatic tuning means when in the LO setting, antenna input signals are attenuated so as to lower the sensitivity for stopping the sweeping operation, but they are not attenuated after the sweeping operation stops. Therefore, there is no substantial deterioration of signal-to-noise ratio due to internal noises in the receiver during normal reception, thus securing a preferable receiving condition.

Figure 2:
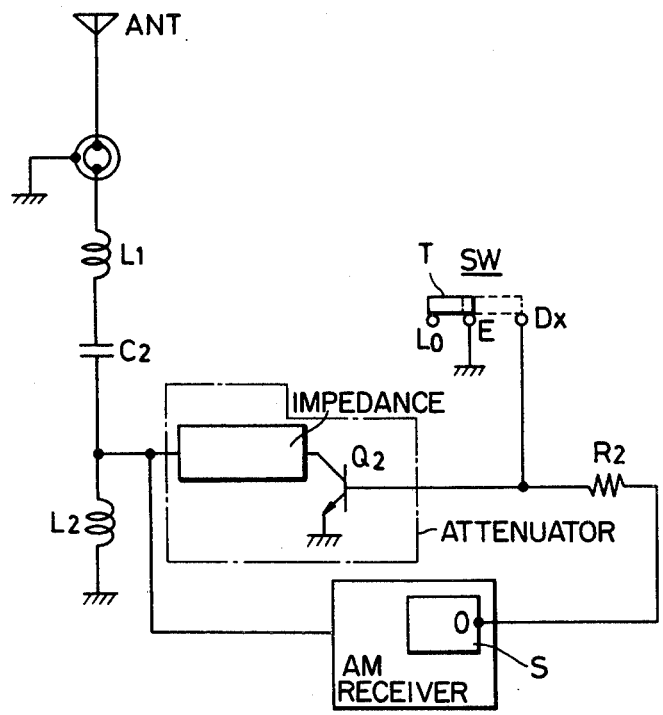
FIG. 2 shows a circuit diagram of a further embodiment according to the present invention.

There is provided an FM receiver in addition to an AM receiver in the above-referred embodiment. However, the present invention can naturally be employed in the case where only an AM receiver is employed, as shown in FIG. 2.

I claim:

1. In combination with an automatic tuning radio receiver comprising radio receiving means having an input terminal to be connected to an antenna, and automatic tuning means actuatable to a first scanning mode so that said receiving means tuningly scans for antenna inputs above a given threshold level, said receiving means then automatically entering a locked non-scanning mode in which it remains tuned to such an input when detected, said receiving means generating a control signal only during said scanning mode; the improvement comprising: attenuating means for controllably attenuating inputs originally detected by said antenna and being operable from a relatively non-attenuating condition to a substantially signal attenuating condition; manually operable switching means operable between a first and a second switching state and coupled with said first attenuator means for respectively inhibiting and enabling operation of said attenuating means; and means responsive to said control signal of said receiving means when said switching means is in said second switching state for operating said first attenuator means in said signal attenuating condition only during the generation of said control signal, whereby when operation of said attenuating means is enabled the attenuating means is operative to attenuate the antenna received signal only during the scanning mode of the receiving means.

2. The combination as claimed in claim 1 wherein said attenuating means is coupled directly to said input terminal of said receiving means.

3. The combination as claimed in claim 1 wherein said receiving means is an AM receiver, and there is further provided an FM radio receiver means and second attenuating means connected directly to the input of said FM radio receiver means for attenuating antenna input signals, said second attenuating means being varied in its attenuating ratio in response to the switch of said switching means between said states thereof.

4. The combination as claimed in claim 3 wherein the first mentioned attenuating means is coupled directly to said input terminal of said receiving means.

5. The combination as claimed in claim 3 wherein said second attentuating means includes a normally forwardly biased rectifier connected to the input of said FM radio receiver means for attenuating the FM antenna inputs when backward biased.

6. The combination as claimed in claim 5, wherein said switching means comprises a grounded movable contact and stationary LO and attenuating inhibiting DX contacts selectively engageable by said movable contact, said DX contact is connected to a circuit point located between said automatic tuning means and said first mentioned attenuator means, where grounding of said first attenuator means disables the same, and said LO contact is connected to said second attenuating means to effect back biasing of said rectifier when said LO terminal is grounded.

7. The combination as claimed in claim 6, wherein there is connected to said FM input a FM loading coil, said second attenuating means is connected in series with said FM antenna loading coil and the load terminals of a current control means also having a control terminal, the control terminal of said control means being connected to said LO contact and a DC power source through a resistor.

8. The combination of claim 1 wherein said attenuation means includes a variable impedance branch coupled directly to said input terminal of said receiving means and having respectively relatively high and low impedance conditions in its non-attenuating and attenuating conditions.

9. The combination of claim 8 wherein said variable impedance branch comprises a current control means having load terminals and control terminal and a fixed impedance element connected in series with said load terminals, the control terminal of said control means being coupled with said first switching means and a signal output point of said receiving means where said first control signal appears, said first control signal rendering the load terminals of said control means conductive if said switching means is in said second switching state.

10. The combination of claim 9 wherein said switching means when operated to said first switching state renders said control means non-responsive to said first control signal by shorting the control terminal of said control means to one of the load terminals thereof.

* * * * *